US009093441B2

United States Patent
Kim et al.

(10) Patent No.: US 9,093,441 B2
(45) Date of Patent: Jul. 28, 2015

(54) SEMICONDUCTOR PACKAGES INCLUDING SEMICONDUCTOR CHIPS HAVING PROTRUSIONS AND METHODS OF FABRICATING THE SAME

(71) Applicant: SK hynix Inc., Icheon-si Gyeonggi-do (KR)

(72) Inventors: Ji Eun Kim, Suwon-si (KR); Cheol Ho Joh, Icheon-si (KR); Hee Min Shin, Seongnam-si (KR); Kyu Won Lee, Seoul (KR); Chong Ho Cho, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 18 days.

(21) Appl. No.: 13/846,713

(22) Filed: Mar. 18, 2013

(65) Prior Publication Data

US 2014/0175638 A1    Jun. 26, 2014

(30) Foreign Application Priority Data

Dec. 21, 2012    (KR) .................. 10-2012-0151421

(51) Int. Cl.
*H01L 25/04* (2014.01)
*H01L 25/065* (2006.01)
(Continued)

(52) U.S. Cl.
CPC ...... *H01L 23/49827* (2013.01); *H01L 21/6836* (2013.01); *H01L 24/92* (2013.01); *H01L 25/043* (2013.01); *H01L 25/0652* (2013.01); *H01L 25/0657* (2013.01); *H01L 25/0756* (2013.01); *H01L 25/50* (2013.01); *H01L 29/0657* (2013.01); *H01L 24/32* (2013.01); *H01L 24/48* (2013.01); *H01L 24/73* (2013.01); *H01L 24/78* (2013.01); *H01L 2221/68327* (2013.01); *H01L 2224/04042* (2013.01); *H01L 2224/32145* (2013.01); *H01L 2224/32225* (2013.01); *H01L 2224/48227* (2013.01); *H01L 2224/49174* (2013.01); *H01L 2224/73265* (2013.01); *H01L 2224/78346* (2013.01); *H01L 2224/92247* (2013.01); *H01L 2225/0651* (2013.01); *H01L 2225/06562* (2013.01); *H01L 2924/1531* (2013.01)

(58) Field of Classification Search
CPC .............. H01L 25/065; H01L 25/0652; H01L 25/0657; H01L 25/043; H01L 25/0756; H01L 2224/49174
USPC .................................................. 257/686, 777
See application file for complete search history.

(56) References Cited

U.S. PATENT DOCUMENTS 7,723,841 B2    5/2010 Hu
2009/0321950 A1*  12/2009 Takiar et al. .................. 257/777
2011/0079890 A1*  4/2011 Song et al. .................... 257/686
(Continued)

FOREIGN PATENT DOCUMENTS

KR          100886717 B1    2/2009
KR      1020090034180 A    4/2009

*Primary Examiner* — Phat X Cao
(74) *Attorney, Agent, or Firm* — William Park & Associates Ltd.

(57) ABSTRACT

The semiconductor package includes an upper semiconductor chip stacked on a package substrate and a support layer or a lower semiconductor chip disposed between the upper semiconductor chip and the package substrate. The upper semiconductor chip includes a protrusion downwardly extending from an edge thereof. The protrusion of the upper semiconductor chip is combined with a sidewall of the support layer or the lower semiconductor chip. Related methods are also provided.

19 Claims, 17 Drawing Sheets

(51) Int. Cl.
*H01L 25/075* (2006.01)
*H01L 23/498* (2006.01)
*H01L 21/683* (2006.01)
*H01L 25/00* (2006.01)
*H01L 29/06* (2006.01)
*H01L 23/00* (2006.01)

(56) References Cited

U.S. PATENT DOCUMENTS

| | | | |
|---|---|---|---|
| 2012/0149151 A1* | 6/2012 | Tane et al. | 438/109 |
| 2013/0114323 A1* | 5/2013 | Shindo et al. | 365/63 |
| 2014/0003765 A1* | 1/2014 | Tseng et al. | 385/14 |

* cited by examiner

FIRST DIRECTION

SEMICONDUCTOR PACKAGES INCLUDING SEMICONDUCTOR CHIPS HAVING PROTRUSIONS AND METHODS OF FABRICATING THE SAME

CROSS-REFERENCE TO RELATED APPLICATION

The present application claims priority under 35 U.S.C 119(a) to Korean Application No. 10-2012-0151421, filed on Dec. 21, 2012, in the Korean intellectual property Office, which is incorporated herein by reference in its entirety as set forth in full.

BACKGROUND

Embodiments of the present disclosure generally relate to semiconductor packages and methods of fabricating the same and, more particularly, to semiconductor packages including semiconductor chips having protrusions and methods of fabricating the same.

Recently, smaller, thinner and higher performance semiconductor packages are more increasingly in demand. In response to such a demand, chip-scaled package techniques and stack package techniques have been continuously developed.

Semiconductor stack packages have been proposed to improve a packing density thereof. In general, the semiconductor stack packages may be fabricated by stacking a plurality of semiconductor chips on a substrate and electrically connecting the plurality of semiconductor chips to the substrate with a wire bonding technique. Even in fabrication of the semiconductor stack packages, attempts to reduce the thickness and size of the semiconductor stack packages have been still continuously made. For example, many efforts to reduce the thickness of the semiconductor chips have been continuously made. In addition, attempts to prevent the degradation of electrical and physical reliability of the semiconductor packages have been made with the development of thinner semiconductor chips.

SUMMARY

Various embodiments are directed to semiconductor packages including semiconductor chips having protrusions and methods of fabricating the same.

According to some embodiments, a semiconductor package may include an upper semiconductor chip stacked on a package substrate and a support layer or a lower semiconductor chip disposed between the upper semiconductor chip and the package substrate. The upper semiconductor chip may include a protrusion downwardly extending from an edge thereof. The protrusion of the upper semiconductor chip may be combined with a sidewall of the support layer or the lower semiconductor chip.

According to further embodiments, a semiconductor package may include a package substrate, a first stack structure including a plurality of semiconductor chips vertically stacked on the package substrate and laterally shifted in a first direction; and a second stack structure including a plurality of semiconductor chips vertically stacked on the first stack structure and laterally shifted in an opposite to the first direction. Each of the semiconductor chips of the first and second stack structures may include a protrusion downwardly extending from an edge thereof. The protrusion of one of the semiconductor chips is combined with a sidewall of the underlying semiconductor chip or a support layer disposed thereunder.

According to further embodiments, a method of fabricating a semiconductor package may include forming a plurality of semiconductor chips on a first surface of a wafer, applying a patterning process to a second surface of the wafer opposite to the first surface to form step patterns, and slicing the wafer to separate the semiconductor chips from each other. Each of the separated semiconductor chips includes a protrusion defined by the step pattern to vertically extend from an edge thereof.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Figure 1A:
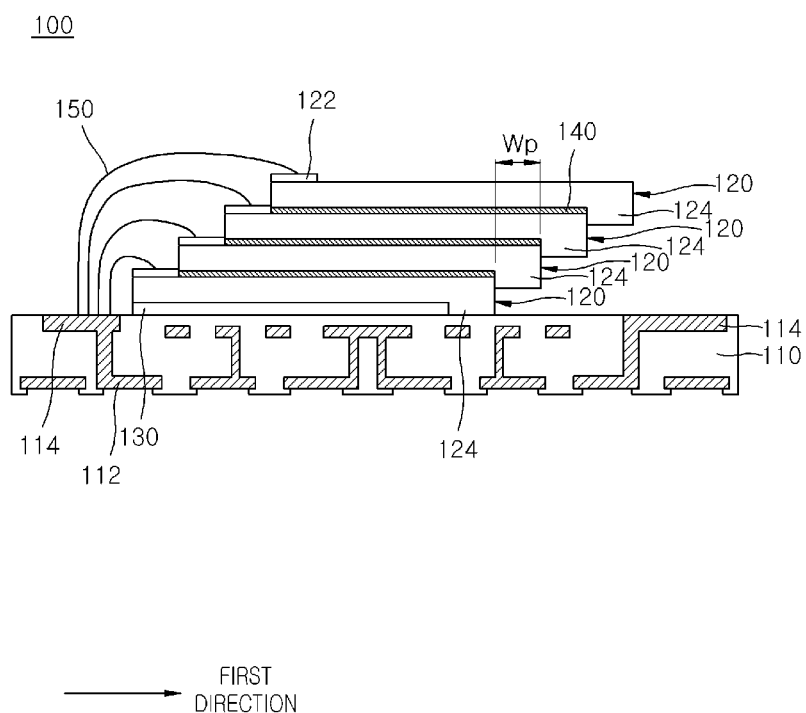
FIG. 1A is a schematic cross sectional view illustrating a semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawing figures, the dimensions of layers and regions may be exaggerated for clarity of illustration.

It will be understood that when an element is referred to as being "on," "above", "below," or "under" another element, it can be directly "on," "above", "below," or "under" the other element, respectively, or intervening elements may also be present. In the drawings, the same reference numerals or the same reference designators denote substantially the same elements. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components However, these terms do not preclude the presence and/or addition of one or more other features, integers, steps, operations, elements, components, and/or groups thereof.

Moreover, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto, or some of the process steps of the methods may be simultaneously performed.

It will be further understood that the term "package substrate" used herein may include an internal circuit therein or may include at least one attack structure thereon.

Figure 1B:
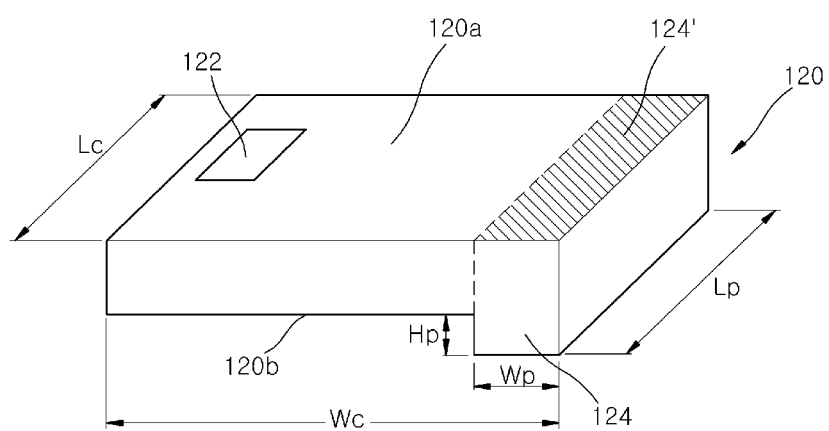
FIG. 1B is a perspective view illustrating one of semiconductor chips in the semiconductor package of FIG. 1.

FIG. 1A is a schematic cross sectional view illustrating a semiconductor package according to an embodiment. FIG. 1B is a perspective view illustrating one of semiconductor chips in the semiconductor package of FIG. 1. Referring to FIG. 1A, a semiconductor package 100 may include a package substrate 110 and semiconductor chips 120 stacked on the package substrate 110. Although FIG. 1 illustrates an example that the number of the stacked semiconductor chips 120 is four, the inventive concept is not limited thereto. For example, the semiconductor package 100 may include one or more semiconductor chips stacked on the package substrate 110. As illustrated in FIG. 1, the package substrate 110 may include an integrated circuit 112 disposed therein, and the integrated circuit 112 may be formed in at least one planar layer. The package substrate 110 may further include bonding pads 114 electrically connected to the integrated circuit 112. The bonding pads 114 may be electrically connected to the semiconductor chips 120. The bonding pads 114 may be disposed on a top surface of a body of the package substrate 110. The semiconductor chips 120 may be stacked on the top surface of the body of the package substrate 110.

The semiconductor chips 120 may be stacked on the package substrate 110 to have a step structure. Each of the semiconductor chips 120 may include bonding pads 122 disposed on a first surface of a body thereof, and the bonding pads 122 may be electrically connected to the package substrate 110. The bonding pads 122 may be disposed on an edge of each of the semiconductor chips 120. Thus, if the semiconductor chips 120 are vertically stacked and laterally shifted to have a step structure, the bonding pads 122 of the semiconductor chips 120 may be exposed. Each of the semiconductor chips 120 may include a protrusion 124 downwardly extending from an edge thereof. In some embodiments, the protrusions 124 may downwardly extend from the edges of the semiconductor chips 120 opposite to the bonding pads 122. Thus, the protrusion 124 of each semiconductor chip 120 may be combined with a sidewall of the underlying semiconductor chip 120 disposed therebelow. The protrusion 124 of each semiconductor chip 120 may also be combined with a sidewall of a support layer 130 disposed on the package substrate 110. As a result, the protrusions 124 may be attached to the sidewalls of the underlying semiconductor chips 120 and the support layer 130 to stably fix the semiconductor chips 120 to the package substrate 110. A width (Wp) of the protrusions 124 may be equal to a distance that each of the semiconductor chips 120 is laterally shifted in a first direction when the semiconductor chips 120 are vertically stacked to have a step structure.

Referring to FIG. 1B, when the bonding pad 122 of the semiconductor chip 120 may be disposed on a first surface 120a of the semiconductor chip 120, the protrusion 124 may be disposed on a second surface 120b of the semiconductor chip 120. The second surface 120b may be opposite to the first surface 120a. Further, when the protrusion 124 is projected on the first surface 120a and the bonding pad 122 is disposed on a first edge of the semiconductor chip 120, a projected protrusion 124' may be located at a second edge of the semiconductor chip 120 opposite to the first edge. The protrusion 124 may extend from the second surface 120b of the semiconductor chip 120. That is, the protrusion 124 and the semiconductor chip 120 may constitute a single unified body without any heterogeneous junction therebetween.

In some embodiments, the protrusion 124 may have a uniform height (Hp) from the second surface 120b. For example, the protrusion 124 may extend from the second surface 120b to have a height (Hp) of at least 5 micrometers. In such a case, if the semiconductor chip 120 has a minimum limited thickness of about 10 micrometers, the height (Hp) of the protrusion 124 may correspond to half of a minimum limited thickness of the semiconductor chip 120. Thus, the protrusion 124 may increase the coherence between the semiconductor chips 120 or between the semiconductor chips 120 and the support layer 130.

It should be readily understood that the protrusion 124 according to an embodiment of the present invention may have a bar shape on the second surface 120b. For example, the width (Wp) of the protrusion 124 may be within the range of about one thirtieth to about one fortieth a width (Wc) of the semiconductor chip 120. A length (Lp) of the protrusion 124 may be substantially equal to a length (Lc) of the semiconductor chip 120. That is, the protrusion 124 may have the width (Wp) of about 300 micrometers if the width (Wc) of the semiconductor chip 120 is within a range of about 9 millimeters to about 12 millimeters. The protrusion 124 may have a length (Lp) of about 9 millimeters to about 12 millimeters if the length (Lc) of the semiconductor chip 120 is within a range of about 9 millimeters to about 12 millimeters.

Referring again to FIG. 1A, the support layer 130 may be disposed on the package substrate 110, as mentioned above. The support layer 130 may be, for example, a dummy pattern not having any integrated circuits. The support layer 130 may be an adhesive layer filling a space between the lowermost semiconductor chip 120 and the package substrate 110. In some embodiments, the support layer 130 may be an insulation layer or an epoxy layer. The support layer 130 may not include any protrusions on an edge thereof.

The lowermost one of the semiconductor chips 120 may be stacked on the support layer 130. In such a case, the lowermost semiconductor chip 120 may be stacked on the support layer 130 such that the protrusion 124 of the lowermost semiconductor chip 120 is combined with a sidewall of the support layer 130. The second lowermost one of the semiconductor chips 120 may be stacked on the lowermost semiconductor chip 120. In such a case, the second lowermost semiconductor chip 120 may be stacked on the lowermost semiconductor chip 120. As a result, the protrusion 124 of the second lowermost semiconductor chip 120 may be combined with a sidewall of the lowermost semiconductor chip 120. The remaining semiconductor chips 120 may be sequentially stacked using the same method as described above. Although not shown in the drawings, an adhesive layer may be disposed between the support layer 130 and the package substrate 110 to attach the support layer 130 to the package substrate 110. The semiconductor chips 120 may also be attached or bonded to each other by an adhesive layer 140 disposed therebetween.

The adhesive layer 140 may include a general adhesive layer such as an epoxy layer. The bonding pads 122 on the first surfaces 120a of the semiconductor chips 120 may be electrically connected to the bonding pads 114 of the package substrate 110 through bonding wires 150.

As described above, a semiconductor package according to some embodiments may include a plurality of semiconductor chips vertically stacked on a package substrate. Each of the semiconductor chips may include a protrusion disposed under an edge thereof. The plurality of semiconductor chips may have the same configuration and function. Alternatively, the plurality of stacked semiconductor chips may have different configurations or functions from each other. The protrusion of each of the stacked semiconductor chips may be combined with a sidewall of the underlying semiconductor chip or a support layer disposed thereunder. Thus, even though a thickness of each semiconductor chip is reduced, the protrusions of the stacked semiconductor chips may improve the structural stability of the semiconductor package.

Figure 2A:
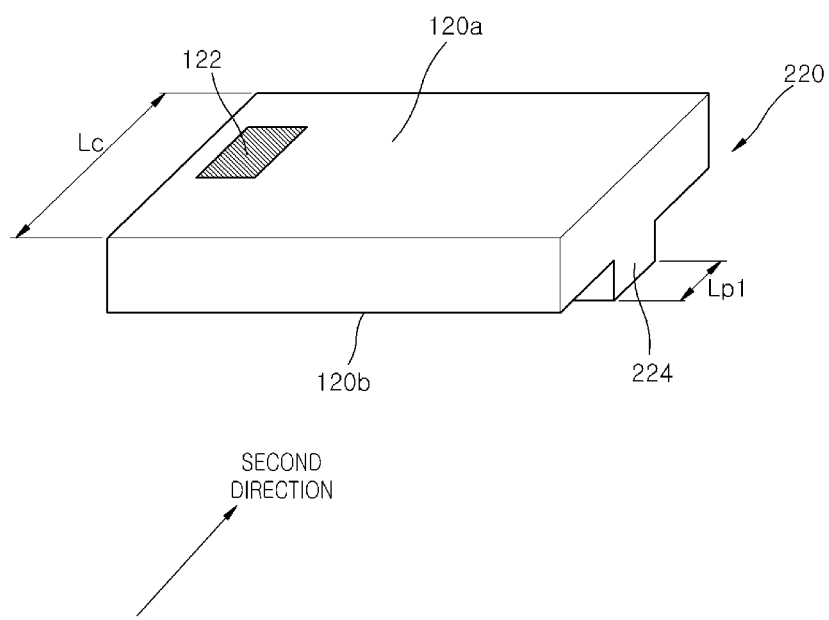
FIGS. 2A and 2B are perspective views illustrating semiconductor chips stacked in semiconductor packages according to some embodiments.
Figure 2B:
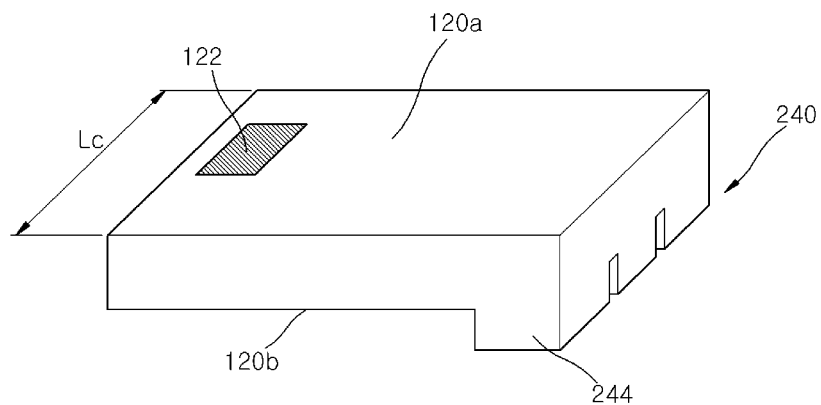
Figure 2B:
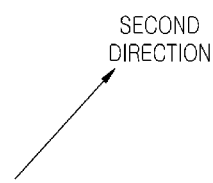

FIGS. 2A and 2B are perspective views illustrating semiconductor chips stacked in semiconductor packages according to some embodiments. Semiconductor chips 220 and 240 shown in FIGS. 2A and 2B may have substantially the same configuration as the semiconductor chip 120 of FIG. 1A or 1B except for protrusions. That is, the semiconductor chips 220 and 240 shown in FIGS. 2A and 2B may be different from the semiconductor chip 120 of FIG. 1A or 1B in terms of a shape of the protrusions.

Referring to FIG. 2A, a protrusion 224 of the semiconductor chip 220 may have an island shape. For example, the protrusion 224 may have a length (Lp1) which is less than a length (Lc) of the semiconductor chip 220. The protrusion 224 may be disposed under a middle portion of an edge of the semiconductor chip 220 opposite to the bonding pad 122. Alternatively, although not shown in the drawings, the protrusion 224 may be shifted along a second direction from the middle portion of the edge of the semiconductor chip 220.

Referring to FIG. 2B, a protrusion 244 of the semiconductor chip 240 may include a plurality of island-shaped patterns which are arrayed along the second direction under an edge of the semiconductor chip 240 opposite to the bonding pad 122.

Figure 3:
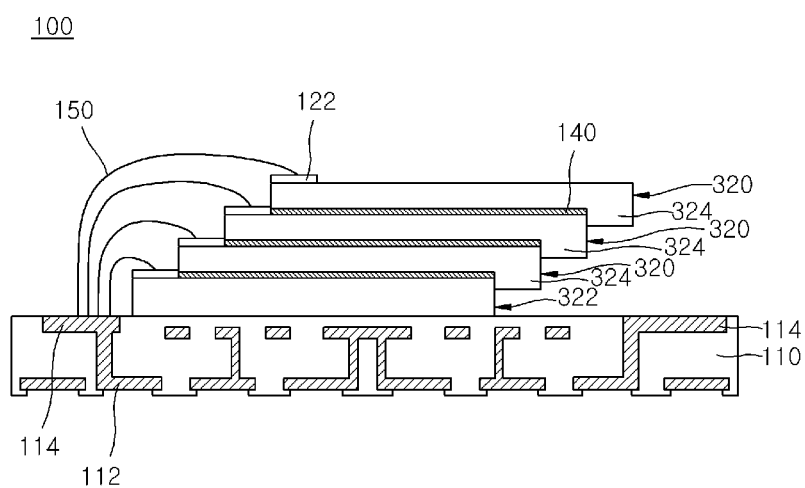
FIG. 3 is a schematic cross sectional view illustrating a semiconductor package according to another embodiment.

FIG. 3 is a schematic cross sectional view illustrating a semiconductor package according to another embodiment. Referring to FIG. 3, a semiconductor package 300 may include the package substrate 110 and a plurality of semiconductor chips 320 and 322 stacked on the package substrate 110. As illustrated, the lowermost semiconductor chip 322 on the package substrate 110 may be configured not to have any protrusions. In such a case, an element corresponding to the support layer 130 of FIG. 1A may be absent between the lowermost semiconductor chip 322 and the package substrate 110. As a result, the semiconductor package 300 may have substantially the same configuration as the semiconductor package 100 without the support layer 130. The remaining semiconductor chips 320 may be stacked on the lowermost semiconductor chip 322, and each of the semiconductor chips 320 may include a protrusion 324. The protrusion 324 may have the same configuration as any one of the protrusions 124, 224 and 244 illustrated in FIGS. 1B, 2A and 2B. Thus, the protrusion 324 of each of the semiconductor chips 320 may be combined with a sidewall of the underlying semiconductor chip 320 or the lowermost semiconductor chip 322.

Figure 4:
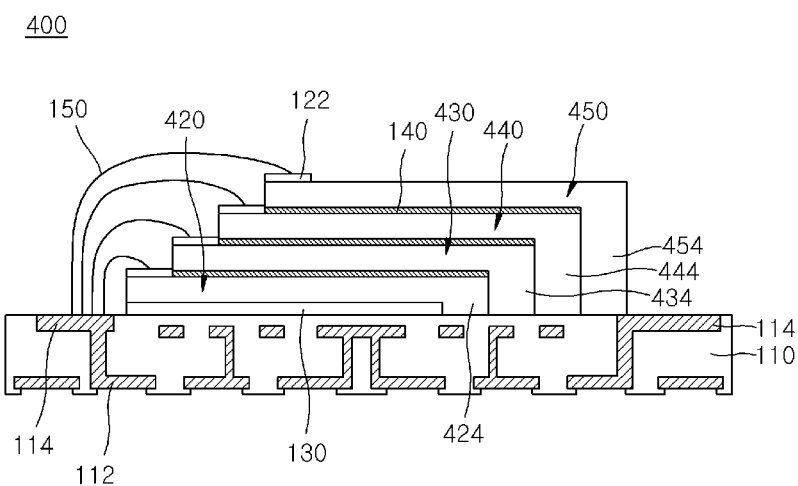
FIG. 4 is a schematic cross sectional view illustrating a semiconductor package according to yet another embodiment.

FIG. 4 is a schematic cross sectional view illustrating a semiconductor package according to yet another embodiment. Referring to FIG. 4, a semiconductor package 400 may include the package substrate 110 and a plurality of semiconductor chips 420, 430, 440, and 450 stacked on the package substrate 110. The semiconductor package 400 may have substantially the same configuration as the semiconductor package 100 illustrated in FIG. 1A except for protrusions. That is, the semiconductor package 400 may be different from the semiconductor package 100 in terms of shapes of the protrusions. As illustrated, protrusions 424, 434, 444, and 454 of the semiconductor chips 420, 430, 440 and 450 may extend to directly contact the package substrate 110. That is, the protrusions 424, 434, 444, and 454 may have different heights to directly contact the package substrate 110. Thus, the protrusions 424, 434, 444, and 454 may fully support the semiconductor chips 420, 430, 440, and 450 to improve the structural stability of the semiconductor package 400.

Figure 5:
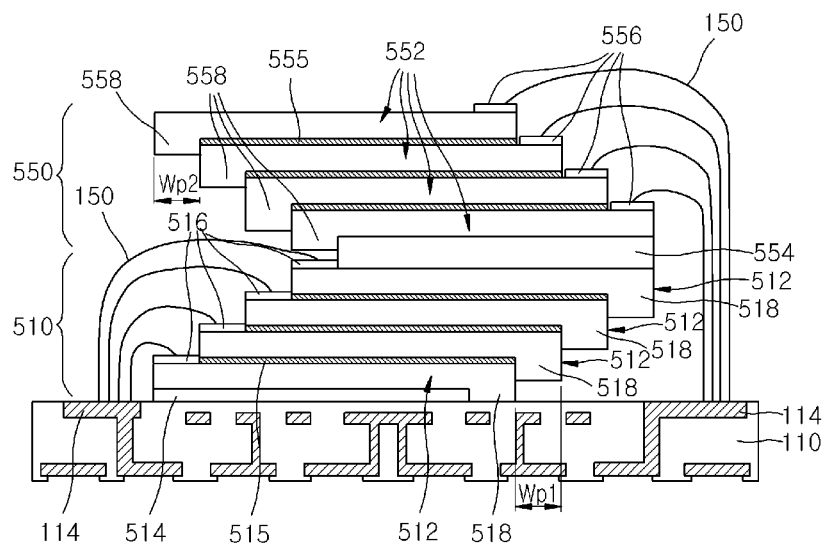
FIG. 5 is a schematic cross sectional view illustrating a semiconductor package according to still another embodiment.
Figure 5:
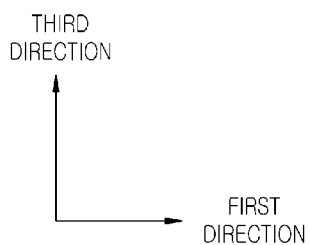

FIG. 5 is a schematic cross sectional view illustrating a semiconductor package according to still another embodiment of the present invention. Referring to FIG. 5, a semiconductor package 500 may include the package substrate 110, a first stack structure 510 disposed on the package substrate 110, and a second stack structure 550 disposed on the first stack structure 510. The first stack structure 510 may include a plurality of semiconductor chips 512 vertically stacked in a third direction and laterally shifted in a first direction on the package substrate 110. A first support layer 514 may be disposed between a lowermost semiconductor chip of the semiconductor chips 512 and the package substrate 110. The first support layer 514 may be, for example, a dummy pattern not having any integrated circuits. The first support layer 514 may be an adhesive layer filling a space between the lowermost semiconductor chip 512 and the package substrate 110. In some embodiments, the first support layer 514 may be an insulation layer or an epoxy layer.

The first stack structure 510 may have substantially the same configuration as a stack structure including the semiconductor chips 120 stacked on the package substrate 110 of FIG. 1. Alternatively, although not shown in the drawings, the first stack structure 510 may have substantially the same configuration as a stack structure including the semiconductor chips 322 and 320 stacked on the package substrate 110 of FIG. 3. Still alternatively, although not shown in the drawings, the first stack structure 510 may have substantially the same configuration as a stack structure including the semiconductor chips 420, 430, 440, and 450 stacked on the package substrate 110 of FIG. 4. As illustrated in FIG. 5, each of the semiconductor chips 512 has a protrusion 518 downwardly extending from an edge thereof. Thus, the protrusion 518 of each semiconductor chip 512 may be combined with a sidewall of the underlying semiconductor chip 512 disposed therebelow or a sidewall of the first support layer 514 disposed on the package substrate 110. As a result, the protrusions 518 may be attached to the sidewalls of the underlying semiconductor chips 512 and the first support layer 514 to stably fix the semiconductor chips 512 to the package substrate 110. A width Wp1 of the protrusions 518 may be equal to a distance that each of the semiconductor chips 512 is laterally shifted when the semiconductor chips 512 are vertically stacked to have a step structure. In some embodiments, each of the protrusions 518 may have the same configuration as one of the protrusions 124, 224, and 244 described with reference to FIGS. 1B, 2A and 2B. Alternatively, the protrusions 518 may have substantially the same configurations as the protrusions 424, 434, 444, and 454 described with reference to FIG. 4, respectively.

Referring again to FIG. 5, a second stack structure 550 may be disposed on the first stack structure 510. The second stack structure 550 may include a plurality of semiconductor chips 552. The plurality of semiconductor chips 552 may be vertically stacked in the third direction and laterally shifted in an opposite direction to the first direction to have a step structure.

A second support layer 554 may be disposed between the uppermost semiconductor chip 512 of the first stack structure 510 and the lowermost semiconductor chip 552 of the second stack structure 550. The second support layer 554 may be, for example, a dummy pattern not having any integrated circuits. The second support layer 554 may separate the uppermost semiconductor chip 512 of the first stack structure 510 from the lowermost semiconductor chip 552 of the second stack structure 550 by a predetermined distance. In some embodiments, the second support layer 554 may be an insulation layer or an epoxy layer.

The second stack structure 550 may have substantially the same configuration as the first stack structure 510. That is, each of the semiconductor chips 552 may include a protrusion 558 downwardly extending from an edge thereof. Thus, the protrusion 558 of each semiconductor chip 552 may be combined with a sidewall of the underlying semiconductor chip 552 disposed therebelow or a sidewall of the second support layer 554 disposed on the first stack structure 510. As a result, the protrusions 558 may be attached to the sidewalls of the underlying semiconductor chips 552 and the second support layer 554 to stably fix the semiconductor chips 552 to the first stack structure 510 and the package substrate 110. Further, a width (Wp2) of the protrusions 558 may be equal to a distance that each of the semiconductor chips 552 is laterally shifted when the semiconductor chips 552 are vertically stacked to have a step structure. In some embodiments, a configuration of the protrusions 558 of the second stack structure 550 may be substantially the same as that of the protrusions 518 of the first stack structure 510 in terms of a width, a length, a height, and a shape.

As illustrated in FIG. 5, an adhesive layer 515 may be disposed between the semiconductor chips 512 of the first stack structure 510. An adhesive layer 555 may also be disposed between the semiconductor chips 552 of the second stack structure 550. That is, the semiconductor chips 512 may be attached to each other by the adhesive layer 515 disposed therebetween, and the semiconductor chips 552 may be attached to each other by the adhesive layer 555 disposed therebetween. Bonding pads 516 and 556 of the semiconductor chips 512 and 552 may be electrically connected to the bonding pads 114 of the package substrate 110 through the bonding wires 150.

As described above, the semiconductor chips 512 of the first stack structure 510 may be laterally shifted in a first direction when the semiconductor chips 512 are vertically stacked. The semiconductor chips 552 of the second stack structure 550 may then be laterally shifted in an opposite direction to the first direction when the semiconductor chips 552 are vertically stacked. Further, each of the semiconductor chips 512 and 558 may include the protrusion 518 or 558. Thus, a structural stability of the semiconductor package 500 including the semiconductor chips 512 and 558 may be improved because of the presence of the protrusions 518 and 558. The structural stability relating to the protrusions 518 and 558 of the semiconductor package 500 may be verified during a wire bonding process used in fabrication of the semiconductor package 500.

Figure 6A:
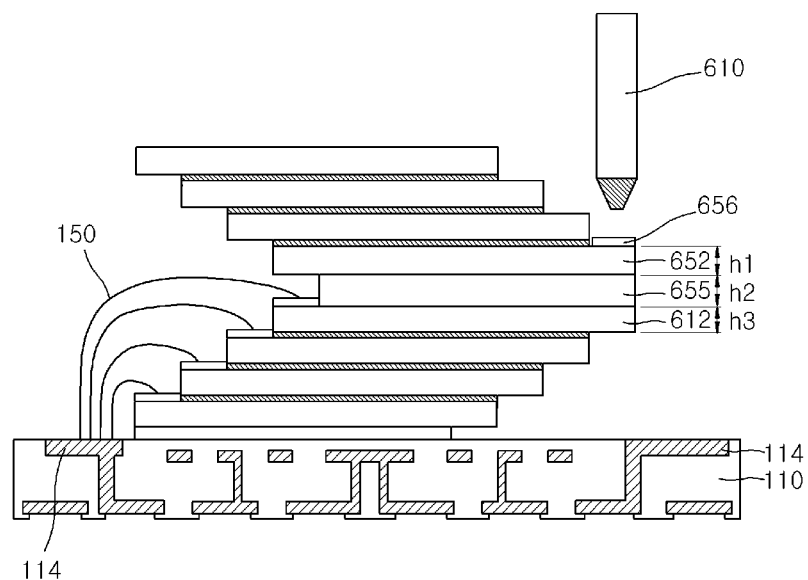
FIGS. 6A and 6B are cross sectional views illustrating a comparative example of a semiconductor package and a semiconductor package according to an embodiment, respectively.
Figure 6B:
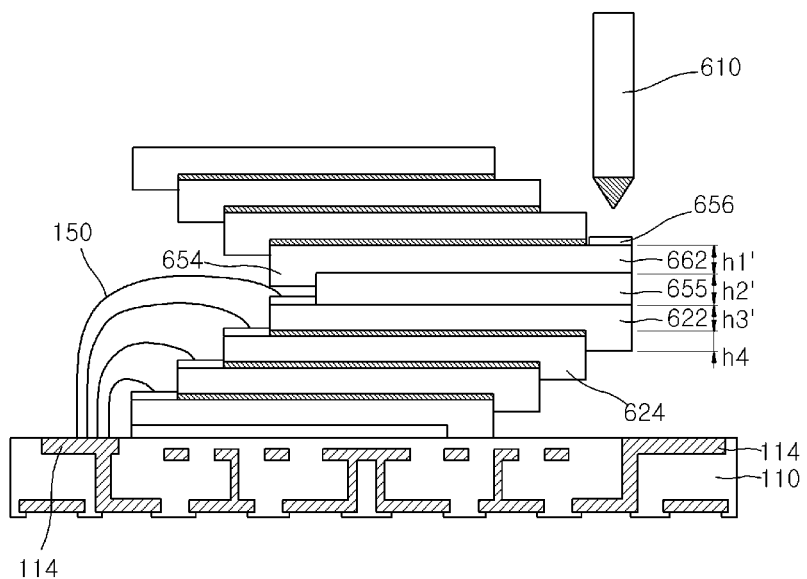

FIG. 6A is a cross sectional view illustrating a comparative example of a semiconductor package, and FIG. 6B is a cross sectional view illustrating a semiconductor package according to an embodiment.

In general, the wire bonding process may include a step of applying pressure and vibration to a bonding pad with a capillary (610 of FIGS. 6A and 6B) of a bonding apparatus to attach a bonding wire to the bonding pad. In such a case, when each of stacked semiconductor chips has a thickness which is less than a minimum critical thickness, the thin semiconductor chips may be damaged or bounced. A pressure and a vibration of the capillary may cause a bonding failure between the bonding pad and the bonding wire. FIG. 6A illustrates an example when each of stacked semiconductor chips 612 and 652 and a support layer 655 have a thickness less than a minimum critical thickness without any protrusions. That is, the lowermost semiconductor chip 652, the support layer 655 and the uppermost semiconductor chip 612 may be disposed under a bonding pad 656 of the lowermost semiconductor chip 652. The lowermost semiconductor chip 652, the support layer 655, and the uppermost semiconductor chip 612 may have a thickness H1, a thickness H2, and a thickness H3, respectively. Thus, when the wire bonding process is applied to the bonding pad 656, the pressure and vibration of the capillary 610 may be directly conducted to a supporting structure including the lowermost semiconductor chip 652, the support layer 655, and the uppermost semiconductor chip 612. That is, a total thickness of the supporting structure may be a sum of the thicknesses H1, H2, and H3. If the thickness H1 of the lowermost semiconductor chip 652 is less than a minimum critical thickness thereof and the thickness H3 of the uppermost semiconductor chip 612 is less than a minimum critical thickness thereof, the supporting structure under the bonding pad 656 may be bounced or damaged. The pressure and the vibration of the capillary 610 may cause a bonding failure.

Referring to FIG. 6B, each of semiconductor chips 622 may include a protrusion 624 and each of semiconductor chips 662 may include a protrusion 654. Thus, a total thickness of a supporting structure located under the bonding pad 656 may correspond to a sum of a thickness H1' of the lowermost semiconductor chip 662, a thickness H2' of the supporting layer 655. The total thickness of the supporting structure may also include the sum of a thickness H3' of the uppermost semiconductor chip 622, and a height H4 of the protrusion 624. Accordingly, when a wire bonding process is applied to the bonding pad 656 disposed on the lowermost semiconductor chip 662, the protrusions 624 of the semiconductor chips 622 may also support the lowermost semiconductor chip 662. That is, the protrusions 624 of the semiconductor chips 622 may prevent the lowermost semiconductor chip 662 from being damaged or bounced. The lowermost semiconductor chip 662 may be damaged during the wire bonding process applied to the bonding pad 656 even though the thicknesses H1' and H3' of the semiconductor chips 662 and 622 are reduced. As a result, the reliability of the wire bonding process may be improved because of the presence of the protrusions 624.

The aforementioned advantage that can be obtained during the wire bonding process may be merely one of various effects which are deducible from the configurations of the embodiments.

Figure 7:
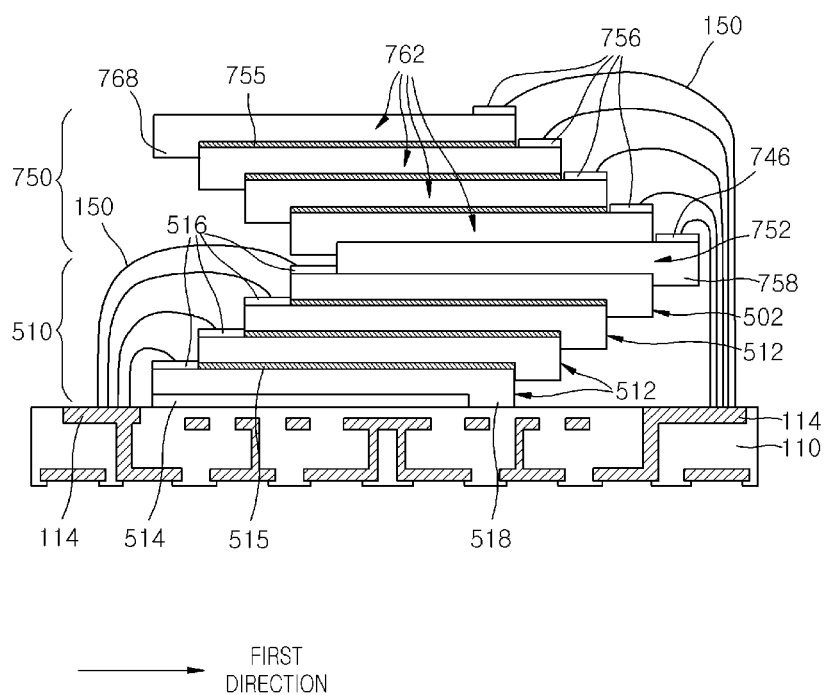
FIG. 7 is a schematic cross sectional view illustrating a semiconductor package according to yet still another embodiment.

FIG. 7 is a schematic cross sectional view illustrating a semiconductor package according to yet still another embodiment. Referring to FIG. 7, a semiconductor package 700 may include the package substrate 110, the first stack structure 510 disposed on the package substrate 110, and a second stack structure 750 disposed on the first stack structure 510. A difference between the present embodiment and the previous embodiment illustrated in FIG. 5 is that the second stack structure 750 of the semiconductor package 700 may be disposed on the first stack structure 510 without use of the second support layer 554 shown in FIG. 5.

The second stack structure 750 may include a lowermost semiconductor chip 752 and semiconductor chips 762 which are sequentially stacked on an uppermost semiconductor chip 502 of the first stack structure 510. In such a case, no element corresponding to the second support layer 554 of FIG. 5 may exist between the uppermost semiconductor chip 502 and the lowermost semiconductor chip 752, as described above. The lowermost semiconductor chip 752 of the second stack structure 750 may be disposed on the uppermost semiconductor chip 502. As a result, a protrusion 758 of the lowermost semiconductor chip 752 may be combined with a sidewall of an edge of the uppermost semiconductor chip 502 opposite to the bonding pad 516. That is, the lowermost semiconductor chip 752 of the second stack structure 750 may also be laterally shifted in the first direction on the uppermost semiconductor chip 502. In addition, a bonding pad 746 of the lowermost semiconductor chip 752 may be disposed on the protrusion 758 of the lowermost semiconductor chip 752. The semiconductor chips 762 may be disposed on the lowermost semiconductor chip 752 to have the same configuration as the semiconductor chips 552 illustrated in FIG. 5.

Figure 8:
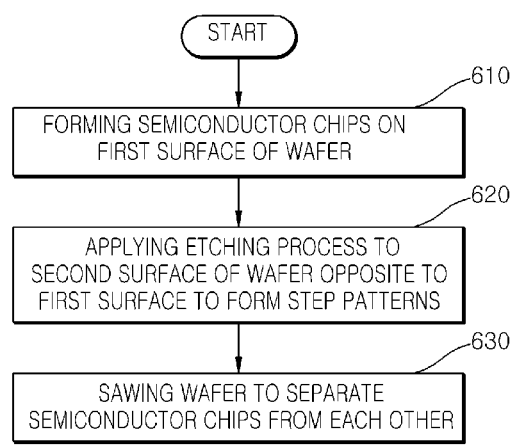
FIG. 8 is a flow chart illustrating a method of fabricating a semiconductor package according to an embodiment.

FIG. 8 is a flow chart illustrating a method of fabricating a semiconductor package according to an embodiment. Referring to FIG. 8, a plurality of semiconductor chips may be formed on a first surface of a wafer (Block 810). The plurality of semiconductor chips may be formed using general processes well known in the art. An etching process may be applied to a second surface of the wafer opposite to the first surface to form step patterns (Block 820). The step patterns may be formed using a mechanical polishing process or a chemical etching process. The wafers including the step patterns may be sliced to separate the semiconductor chips from each other (Block 830). Each of the separated semiconductor chips may include a protrusion vertically extending from an edge thereof, and the protrusion may be defined when the step patterns are formed. Although not shown in FIG. 8, a method of fabricating a semiconductor package according to an embodiment may further include a step of stacking the separated semiconductor chips on a package substrate. In such a case, the semiconductor chips may be stacked such that the protrusion of the upper semiconductor chip is combined with a sidewall of an edge of the lower semiconductor chip under the upper semiconductor chip. According to an embodiment, when the semiconductor chips are vertically stacked on the package substrate, the upper semiconductor chip may be laterally shifted on the lower semiconductor chip by a width of the protrusion.

Figure 9:
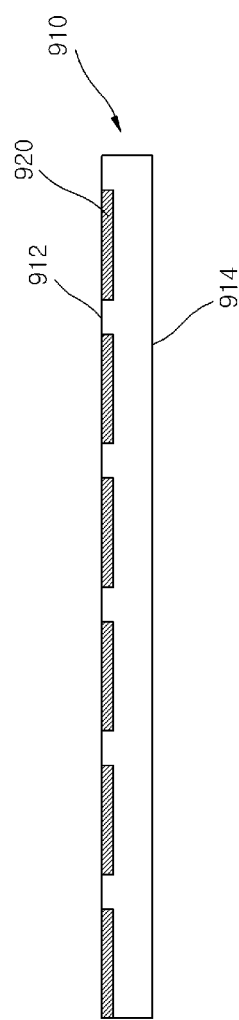
FIGS. 9 to 14 are cross sectional views illustrating a method of fabricating a semiconductor package according to an embodiment.

FIGS. 9 to 14 are cross sectional views illustrating a method of fabricating a semiconductor package according to an embodiment. Referring to FIG. 9, a plurality of semiconductor chips 920 may be formed on a first surface 912 of a wafer 910.

Figure 10:
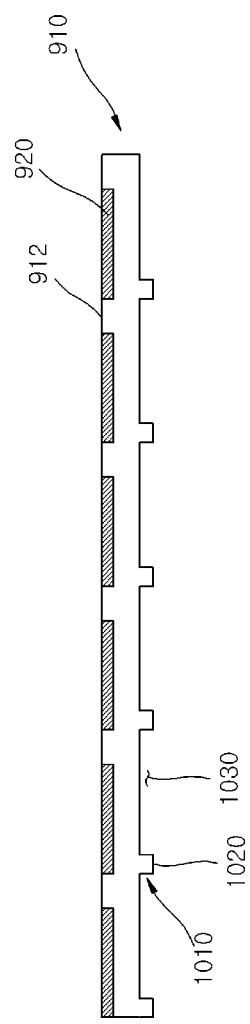

Referring to FIG. 10, a back grinding process and a patterning process may be applied to a second surface (914 of FIG. 9) of the wafer 910 opposite to the first surface 912, thereby forming step patterns 1010. Each of the step patterns 1010 may be formed to include a protruding portion 1020 and a bottom portion 1030.

In some embodiments, the back grinding process, for example, a polishing process may be primarily applied to an entire portion of the second surface 914 to uniformly reduce a thickness of the wafer 910. The polishing process may be performed using a mechanical polishing technique, a chemical polishing technique or a chemical mechanical polishing (CMP) technique. Subsequently, portions of the second surface 914 of the polished wafer may be selectively patterned or removed using the patterning process to form the step patterns 1010. The patterning process may include a mechanical patterning process or a chemical patterning process. When the mechanical patterning process is used in formation of the step patterns 1010, a cutting equipment including a blade having a predetermined width may be utilized. Alternatively, when the chemical patterning process is used in formation of the step patterns 1010, portions of the second surface 914 of the polished wafer may be selectively etched using an etchant or an etch gas. In some embodiments, the step patterns 1010 may be formed such that a step difference between the protruding portions 1020 and the bottom portions 1030 has at least 5 micrometers. That is, the protrusions 1020 may be formed to have a height of about 5 micrometers. In such a case, even when the polished wafer has a minimum critical thickness (which guarantees a structural reliability of the polished wafer) of about 10 micrometers, the height of the protrusions 1020 may be half the thickness of the polished wafer. Thus, if the minimum critical thickness of the polished wafer is at least 10 micrometers, the protrusions 1020 may be formed to have a sufficient height for supporting semiconductor chips which are formed and stacked in subsequent processes. In some embodiments, each of the protrusions 1020 may be formed to have one of various shapes. For example, each of the protrusions 1020 may be formed to have an island shape or a bar shape.

Figure 11:
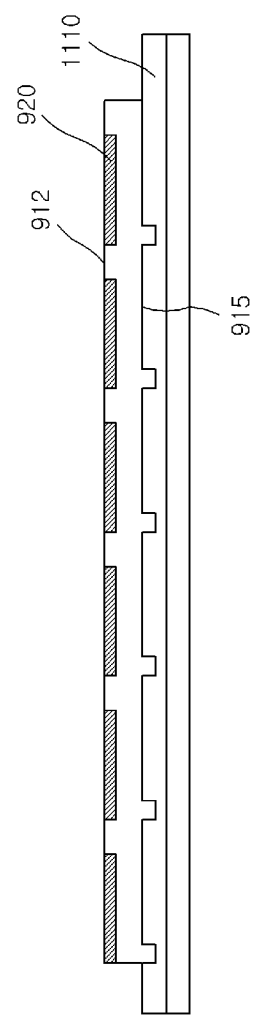

Referring to FIG. 11, an adhesive film 1110 may be attached to a second surface 915 of the wafer 910 including the step patterns 1010. The second surface 915 may include all surfaces of the step patterns 1010 to correspond to an opposite surface to the first surface 912. The adhesive film 1110 may be, for example, an epoxy layer and may be attached to cover the protruding portions 1020 and the bottom portions 1030.

Figure 12:
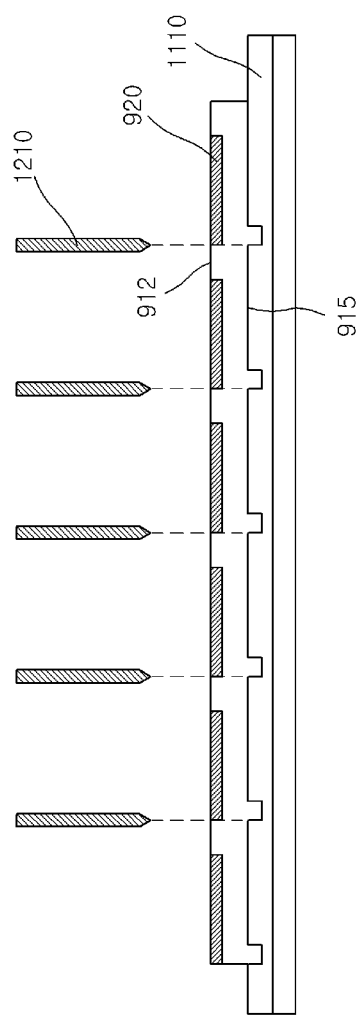

Referring to FIG. 12, the wafer 910 shown in FIG. 11 may be sliced to separate the plurality of semiconductor chips 920 from each other. The wafer 910 may be sliced using a general method which is well known in the art. For example, the wafer 910 may be sliced using sawing blades 1210. After separating the semiconductor chips 920, the adhesive film 1110 may be removed. Each of the separated semiconductor chips 920 may have substantially the same configuration as the semiconductor chip 120, 220, or 240 as illustrated in FIG. 1B, 2A, or 2B.

Figure 13:
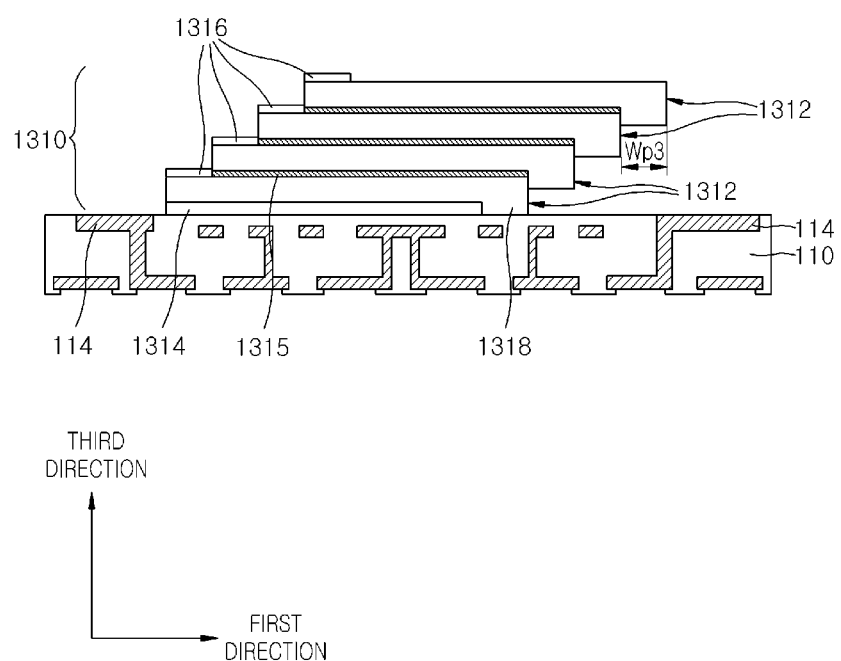

Referring to FIG. 13, a plurality of separated semiconductor chips 1312 may be fabricated using the processes described with reference to FIGS. 9 to 12 and may be provided. Some of the semiconductor chips 1312 may be stacked on a package substrate 110 to form a first stack structure 1310. In some embodiments, the semiconductor chips 1312 may have the same configuration and function. Alternatively, the semiconductor chips 1312 may have different configurations or functions from each other. The protrusions 1020 of the step patterns 1010 illustrated in FIG. 10 may correspond to protrusions 1318 downwardly extending from edges of the respective semiconductor chips 1312.

In some embodiments, a first support layer 1314 may be formed on the package substrate 110 before the semiconductor chips 1312 are stacked. After formation of the first support layer 1314, the semiconductor chips 1312 may be stacked on the first support layer 1314. In more detail, the semiconductor chips 1312 may be vertically stacked in a third direction and laterally shifted in a first direction to form the first stack structure 1310 having a step structure. The semiconductor chips 1312 may be bonded to each other using an adhesive layer 1315 disposed therebetween.

The semiconductor chips 1312 may be stacked such the protrusion 1318 of the upper semiconductor chip 1312 is combined with a sidewall of an edge of the lower semiconductor chip 1312 disposed under the upper semiconductor chip 1312. In such a case, the upper semiconductor chip 1312 may be laterally shifted in the first direction by a width (Wp3) of the protrusion 1318.

Figure 14:
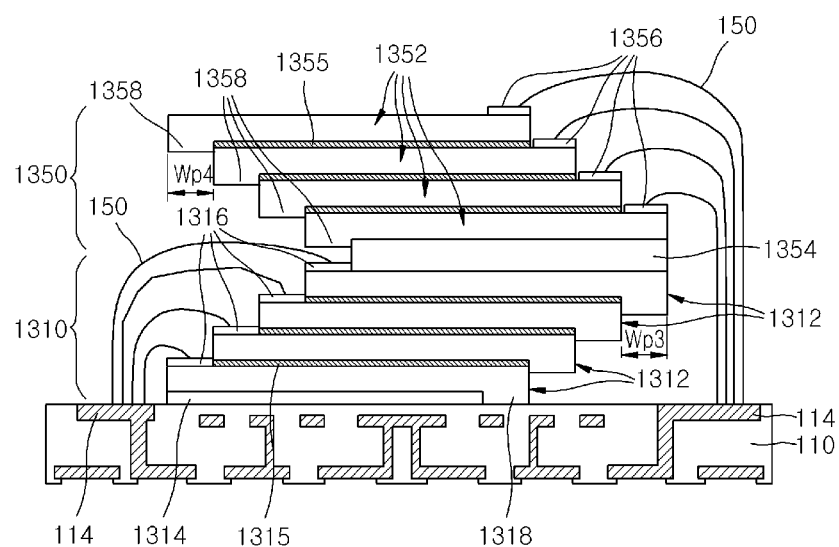
Figure 14:
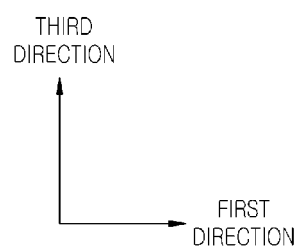

Referring to FIG. 14, a second support layer 1354 may be formed on the first stack structure 1310. A plurality of semiconductor chips 1352 may be stacked on the second support layer 1354 to form a second stack structure 1350. Specifically, the semiconductor chips 1352 may be vertically stacked and laterally shifted in an opposite direction to the first direction to have a step structure. The semiconductor chips 1352 may be bonded to each other using an adhesive layer 1355 disposed therebetween. The semiconductor chips 1352 may be stacked to combine a protrusion 1358 of the upper semiconductor chip 1352 with a sidewall of an edge of the lower semiconductor chip 1352 disposed under the upper semiconductor chip 1352. In such a case, the upper semiconductor chip 1352 may be laterally shifted in an opposite direction to the first direction by a width (Wp4) of the protrusion 1358. Subsequently, a wire bonding process may be performed to electrically connect the bonding pads 114 of the package substrate 110 to bonding pads 1316 and 1356 of the semiconductor chips 1312 and 1352 through bonding wires 150. Although not shown in the drawings, the semiconductor chips 1312 and 1352 and the bonding wires 150 may be encapsulated using a molding process to form a semiconductor package. In some embodiments, the semiconductor package may be formed to include the first stack structure 1310 without the second stack structure 1350. In such a case, the wire bonding process may be performed after formation of the first stack structure 1310, and the molding process may be formed to complete the semiconductor package.

According to the embodiments set forth above, a protrusion downwardly extending from an edge of an upper semiconductor chip may be combined with a sidewall of a lower semiconductor chip disposed under the upper semiconductor chip. Thus, the upper semiconductor chip may be stably stacked on the lower semiconductor chip due to the presence of the protrusion As a result, the structural reliability of a semiconductor package including the upper and lower semiconductor chips may be improved.

The embodiments of the inventive concept have been disclosed above for illustrative purposes. Those skilled in the art will appreciate that various modifications, additions, and substitutions are possible, without departing from the scope and spirit of the inventive concept as disclosed in the accompanying claims.

What is claimed is:

1. A semiconductor package comprising:
   an upper semiconductor chip stacked on a package substrate, including a protrusion; and
   a support layer or a lower semiconductor chip between the upper semiconductor chip and the package substrate,
   wherein the protrusion is a downwardly extended edge portion of the upper semiconductor chip, and the protrusion contacts a sidewall of the support layer or the lower semiconductor chip, and
   wherein the upper semiconductor chip includes a bonding pad disposed on a first surface thereof and the protrusion is disposed on a second surface of the upper semiconductor chip opposite to the first surface.

2. The semiconductor package of claim 1, wherein the protrusion has a width which is within a range of about one thirtieth to about one fortieth a width of the upper semiconductor chip.

3. The semiconductor package of claim 1, wherein the protrusion is disposed to have a uniform height from the second surface.

4. The semiconductor package of claim 3, wherein the protrusion has a height of at least 5 micrometers.

5. The semiconductor package of claim 1, wherein when the protrusion is projected onto the first surface, the projected protrusion is located at an edge of the upper semiconductor chip opposite to the bonding pad.

6. The semiconductor package of claim 1, wherein the upper semiconductor chip is vertically stacked on the support layer or the lower semiconductor chip and laterally shifted by a width of the protrusion to have a step structure.

7. The semiconductor package of claim 1, further comprising at least one additional semiconductor chip on the upper semiconductor chip,
   wherein the support layer is disposed between the package substrate and the upper semiconductor chip or between the upper semiconductor chip and the at least one additional semiconductor chip.

8. The semiconductor package of claim 1, further comprising at least one additional semiconductor chip stacked on the upper semiconductor chip,
   wherein the at least one additional semiconductor chip includes a protrusion downwardly extending from an edge thereof and at least one of the protrusions of the upper semiconductor chip and the at least one additional semiconductor chip has a different height from the other protrusion thereof.

9. The semiconductor package of claim 1, wherein the upper semiconductor chip is stacked on the package substrate to have a step structure.

10. A semiconductor package comprising:
    a package substrate;
    a first stack structure including a plurality of semiconductor chips vertically stacked on the package substrate and laterally shifted in a first direction; and
    a second stack structure including a plurality of semiconductor chips vertically stacked on the first stack structure and laterally shifted in an opposite direction to the first direction,
    wherein each of the semiconductor chips of the first and second stack structures includes a protrusion downwardly extending from an edge thereof wherein one of the protrusions is combined with a sidewall of the underlying semiconductor chip or a support layer disposed thereunder.

11. The semiconductor package 10, wherein each of the semiconductor chips further includes a bonding pad disposed on a first surface thereof and the protrusion of each of the semiconductor chips is disposed on a second surface of the semiconductor chip opposite to the first surface.

12. The semiconductor package of claim 11, wherein the protrusions of the semiconductor chips have a uniform width and a uniform height on edges of the second surfaces of the semiconductor chips.

13. The semiconductor package of claim 12, wherein each of the protrusions has a width which is within a range of about one thirtieth to about one fortieth a width of the corresponding semiconductor chip.

14. The semiconductor package of claim 12, wherein the protrusions have a height of at least 5 micrometers.

15. The semiconductor package of claim 11, wherein the support layer includes at least one of a first support layer disposed between the package substrate and the first stack structure and a second support layer disposed between the first stack structure and the second stack structure.

16. The semiconductor package of claim 15, wherein the second support layer is disposed between an uppermost semiconductor chip of the first stack structure and a lowermost semiconductor chip of the second stack structure.

17. The semiconductor package of claim 15, wherein the protrusions are attached to the second support layer to fix the semiconductor chips of the second stack structure to the first stack structure and the package substrate.

18. The semiconductor package of claim 15, wherein the protrusions are attached to the first support layer.

19. The semiconductor package of claim 10, wherein a width of the protrusions is equal to a distance that each of the semiconductor chips is laterally shifted when the semiconductor chips are vertically stacked to have a step structure.

* * * * *